US012464641B2

United States Patent
Asl et al.

(10) Patent No.: US 12,464,641 B2
(45) Date of Patent: Nov. 4, 2025

(54) TRACE ARRANGEMENT FOR PRINTED CIRCUIT BOARD

(71) Applicant: Cisco Technology, Inc., San Jose, CA (US)

(72) Inventors: Shadi Ebrahimi Asl, Cary, NC (US); Stephen Aubrey Scearce, Apex, NC (US); Linda W. Scott, Winter Springs, FL (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 262 days.

(21) Appl. No.: 18/313,910

(22) Filed: May 8, 2023

(65) Prior Publication Data

US 2024/0381526 A1 Nov. 14, 2024

(51) Int. Cl.
*H05K 1/02* (2006.01)
*H05K 1/03* (2006.01)
*H05K 3/10* (2006.01)

(52) U.S. Cl.
CPC ........... *H05K 1/0296* (2013.01); *H05K 1/038* (2013.01); *H05K 3/10* (2013.01); *H05K 2201/10734* (2013.01)

(58) Field of Classification Search
CPC .................. H05K 1/0296; H05K 1/038; H05K 2201/10734; H05K 3/10
USPC .......................................................... 174/255
See application file for complete search history.

(56) References Cited

U.S. PATENT DOCUMENTS

| 11,057,987 | B2  | 7/2021  | Lou et al.              |
|------------|-----|---------|-------------------------|
| 2018/0113974 | A1 | 4/2018  | Boday et al.            |
| 2018/0184524 | A1 | 6/2018  | Xiong                   |
| 2018/0293345 | A1 | 10/2018 | Shen et al.             |
| 2018/0293545 | A1* | 10/2018 | Sun ............... G06Q 10/08345 |
| 2019/0037684 | A1 | 1/2019  | Park et al.             |
| 2020/0083155 | A1 | 3/2020  | Enriquez Shibayama et al. |
| 2022/0128350 | A1* | 4/2022  | Koul .................... H05K 1/0248 |

OTHER PUBLICATIONS

Z-Zero, "Webinar: Glass-Weave Skew," https://harrisburg.psu.edu/files/pdf/27641/2021/04/21/how-avoid-getting-totally-skewed-hargin.pdf, Apr. 2021, 16 pages.
Z-Zero, "Glass-Weave Skew," https://www.z-zero.com/glass-weave-skew/, Apr. 15, 2005, 5 pages.
Nalla, "Mitigation of glass weave skew using a combination of low DK spread glass, multi-ply dielectric and routing direction," Missouri University of Science and Technology, https://scholarsmine.mst.edu/masters_theses/7859, Jul. 2016, 63 pages.

* cited by examiner

*Primary Examiner* — Tremesha W Burns
(74) *Attorney, Agent, or Firm* — Edell, Shapiro & Finnan, LLC

(57) ABSTRACT

A method of manufacturing a printed circuit board (PCB) includes arranging a first trace segment of a trace on a substrate of the PCB, the substrate being composed of fiber glass strands that define a fiber glass weave pattern, and arranging a second trace segment of the trace on the substrate at a position that is fractionally offset from the first trace segment along an axis by a distance that is less than a ball grid array (BGA) pitch of a BGA based on the fiber glass weave pattern. The BGA pitch is a separation distance along the axis between a center of a first via of the BGA of the PCB and a center of a second via of the BGA.

20 Claims, 9 Drawing Sheets

US 12,464,641 B2

TRACE ARRANGEMENT FOR PRINTED CIRCUIT BOARD

TECHNICAL FIELD

The present disclosure relates to printed circuit boards (PCBs) and traces of PCBs.

BACKGROUND

A printed circuit board (PCB) electrically couples various electronic components with one another. For example, a PCB may include multiple layers, each having different electronic components. Additionally, the PCB may include traces that propagate signals to enable communication between the electronic components, including electronic components positioned on different layers. The substrate of the PCB may be composed of fiber glass bundles that are woven together and secured to one another with a filler material, such as resin, to provide a fiber glass weave. The traces may be placed over and routed along the fiber glass weave.

The propagation characteristics of a signal along a trace may be dependent on the routing of the trace. For example, a time of propagation of the signal may be based on a length of the trace, as well as an impedance of the trace. The impedance of the trace may be further based on the arrangement of the trace along the fiber glass weave. For instance, positioning of the trace at different fiber glass bundles may provide different impedances and different propagation speed/velocity for the trace.

DETAILED DESCRIPTION

Overview

Techniques are provided herein for routing traces for a printed circuit board (PCB). In one example embodiment, a method of manufacturing a PCB includes arranging a first trace segment of a trace on a substrate of the PCB, the substrate being made of fiber glass strands that define a fiber glass weave pattern, and arranging a second trace segment of the trace on the substrate at a position that is fractionally offset from the first trace segment along an axis by a distance that is less than a ball grid array (BGA) pitch of a BGA based on the fiber glass weave pattern. The BGA pitch is a separation distance along the axis between a center of a first via of the BGA of the PCB and a center of a second via of the BGA.

Example Embodiments

Figure 1:
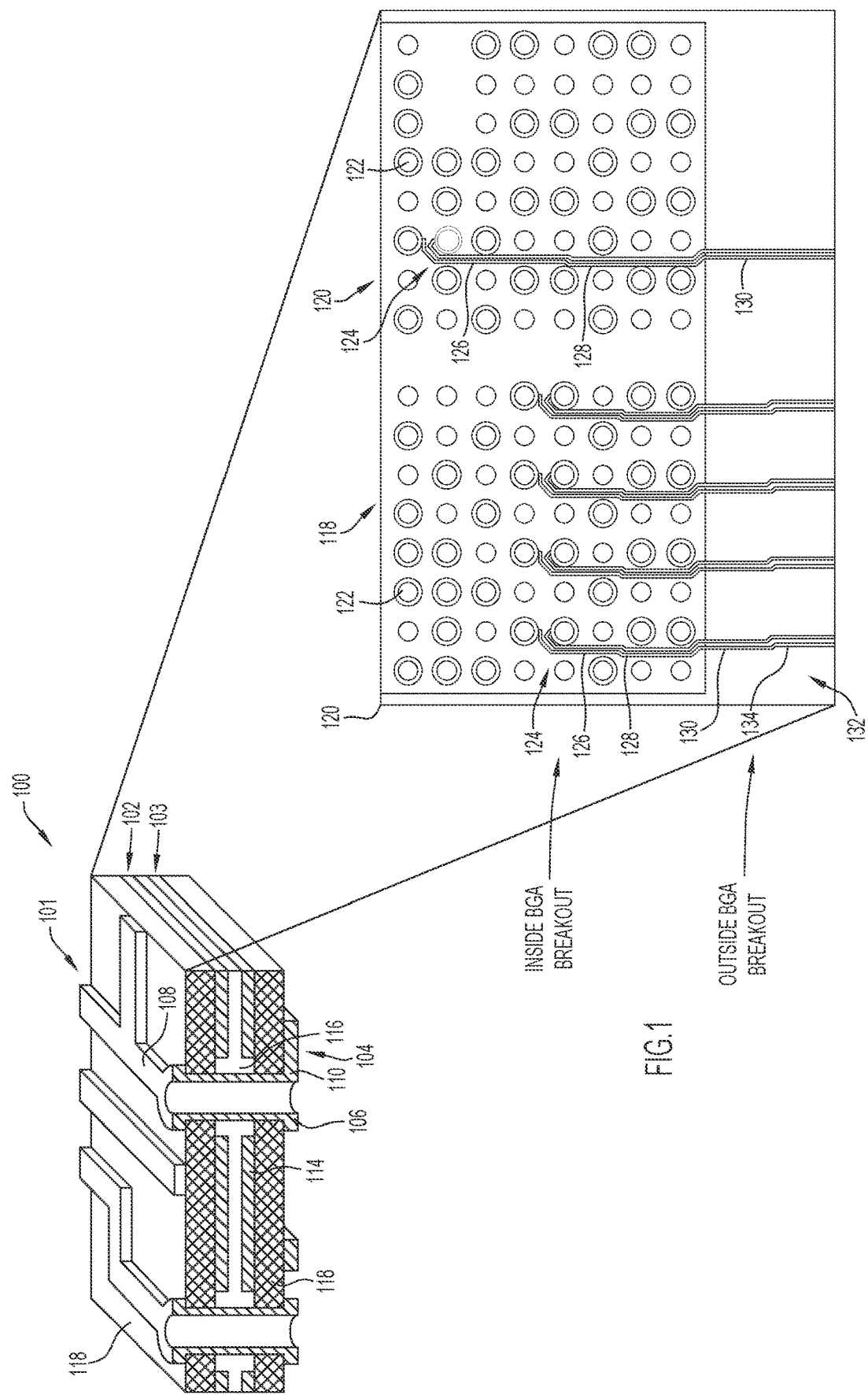
FIG. 1 is a perspective cross-sectional view of a printed circuit board (PCB) that includes multiple layers and traces routed along each layer, according to an example embodiment.

With reference made to FIG. 1, depicted therein is a cross-sectional view of a PCB 100 having a first layer 101 (e.g., a first external layer), a second layer 102 (e.g., a first internal layer), a third layer 103 (e.g., a second internal layer), and a fourth layer 104 (e.g., a second external layer). Each layer 101, 102, 103, 104 (e.g., the external layers) may include different electrical components, such as resistors, transistors, capacitors, switches, inductors, transformers, sensors, diodes, relays, and so forth. The PCB 100 additionally includes vias that may extend through the layers 101, 102, 103, 104 and electrically couple electrical components of the different layers 101, 102, 103, 104 to one another. For example, a first trace 108 may extend from a via 106 and along the first layer 101 to electrically couple the via 106 to electrical components of the first layer 101, and a second trace 110 may extend from the via 106 and along the fourth layer 104 to electrically couple the via 106 to electrical components of the fourth layer 104. As such, a signal (e.g., an electrical signal) may propagate along the first trace 108, the via 106, and the second trace 110 to electrically couple the electrical components of the first layer 102 and of the fourth layer 104 to one another.

However, the via 106 may not be electrically coupled to electrical components of the second layer 102 and/or of the third layer 103. To this end, no trace may extend from the via 106 and along the second layer 102 or along the third layer 103. For instance, a third trace 114 may extend along the third layer 103, but may terminate prior to contacting the via 106. Instead, a void of space or antipad 116 may surround the via 106 at the third layer 103. The antipad 116 may block or interrupt electrical coupling between the via 106 and traces extending along the third layer 103. As an example, the antipad 116 interrupts signal propagation between the third trace 114 and the via 106.

Each of the layers 101, 102, 103, 104 may be formed from a substrate composed of fiber glass material 118 woven together to provide a fiber glass weave pattern. The traces 108, 110, 114 may extend along the fiber glass material 118. As discussed herein, the routing of the traces 108, 110, 114 with respect to the fiber glass weave pattern affects propagation of signals because of the non-homogenous environment provided by the fiber glass weave pattern. For example, different layouts of the fiber glass weave pattern have different dielectric constants that provide different impedances for signal propagation. In this manner, a signal may propagate at different speeds for traces extending along different layouts of the fiber glass weave pattern. For this reason, skew (e.g., fiber glass skew, glass weave skew, fiber weave skew, phase skew, timing skew, line-to-line skew, positive/negative skew), or a difference between the respective durations of time in which signals travel along respective traces that extend along substantially different layouts of the fiber glass weave pattern, may occur. The difference in the time and speed of signal travel along different traces may affect operation of the PCB 100. Indeed, the skew may affect different performance operations, such as signal response behavior, signal integrity, link performance, bit-error-rate performance, communication channel budget, and electromagnetic interference. For example, signals can desynchronize and arrive at target destinations at undesirably different times to affect an integrity of communication between components of the PCB 100. Therefore, it is desirable to route the traces 108, 110, 114 to extend along corresponding, common, or similar layouts of the fiber glass weave pattern to reduce skew between the traces 108, 110, 114. Additionally, it is desirable to route the traces 108, 110, 114 in a manner that avoids contact between the traces 108, 110, 114 with the other vias or electrical components that would otherwise undesirably couple the traces 108, 110, 114 to the other vias or electrical components.

Detailed view of the fiber glass material 118 shows example routing of different traces. In particular, the detailed view the fiber glass material 118 illustrates a ball grid array breakout or breakout region 120, referred to herein as a BGA 120, of a layer of the PCB 100 having multiple rows and columns of vias 122. In addition to electrically coupling to electrical components of other layers of the PCB 100, the vias 122 may electrically couple to pins configured to couple a separate electrical component (e.g., an integrated circuit) to the PCB 100. By way of example, the pins may provide electrical interfaces to which the separate electrical component may physically and electrically couple to the PCB 100 at the BGA 120 (e.g., via solders). Thus, the vias 122 may electrically couple components of the PCB 100 to the separate electrical component. Traces may be routed between adjacent vias 122 within the BGA 120. By way of example, a pair of traces 124, such as a differential pair (e.g., a first trace that propagates a positive signal, a second trace that propagates a negative signal) or two separate single ended traces (e.g., traces that propagate separate, unrelated signals), extends through the BGA 120. For instance, each of the pairs of traces 124 may include a first trace segment 126 and a second trace segment 128 extending between adjacent columns of vias 122 within the BGA 120. The first trace segment 126 and the second trace segment 128 may be offset from one another but remain positioned between the same adjacent column of vias 122. Additionally, the routing of the first trace segment 126 and the second trace segment 128 may avoid undesirable contact of the first trace segment 126 and the second trace segment 128 with certain vias 122. Each of the pairs of traces 124 may also include a third trace segment 130, which extends along a region 132 of the PCB 100 that is external to the BGA 120. That is, the third trace segment 130 does not extend between any of the vias 122. The third trace segment 130 may be offset from the second trace segment 128.

Such routing of the trace segments 126, 128, 130 may enable each trace of the pair of traces 124 to have substantially the same impedance. That is, the particular offset distances between the trace segments 126, 128, 130 may cause the respective trace segments 126, 128, 130 of the different pairs of traces 124 to, collectively, extend along corresponding layouts of the fiber glass weave pattern. As such, a first signal transmitted along one of the traces of the pair may travel at the same speed as a second signal transmitted along the other trace of the pair. For this reason, the respective durations of time in which the signals propagate along the traces of the pairs of traces 124 may substantially match and be synchronized with one another.

In some embodiments, each of a pair of traces 124 may include a fourth trace segment 134 that is offset from the third trace segment 130 to further enable each trace of the pair of traces 124 to extend along corresponding layouts of the fiber glass weave pattern. Indeed, each trace of the pairs of traces 124 may include any suitable number of trace segments, such as two trace segments or more than four trace segments (e.g., more than three trace segments routed within the BGA 120), that are offset from one another by a particular distance to extend the traces of the pairs of traces 124 along corresponding layouts of the fiber glass weave pattern and reduce skew between the traces.

Figure 2:
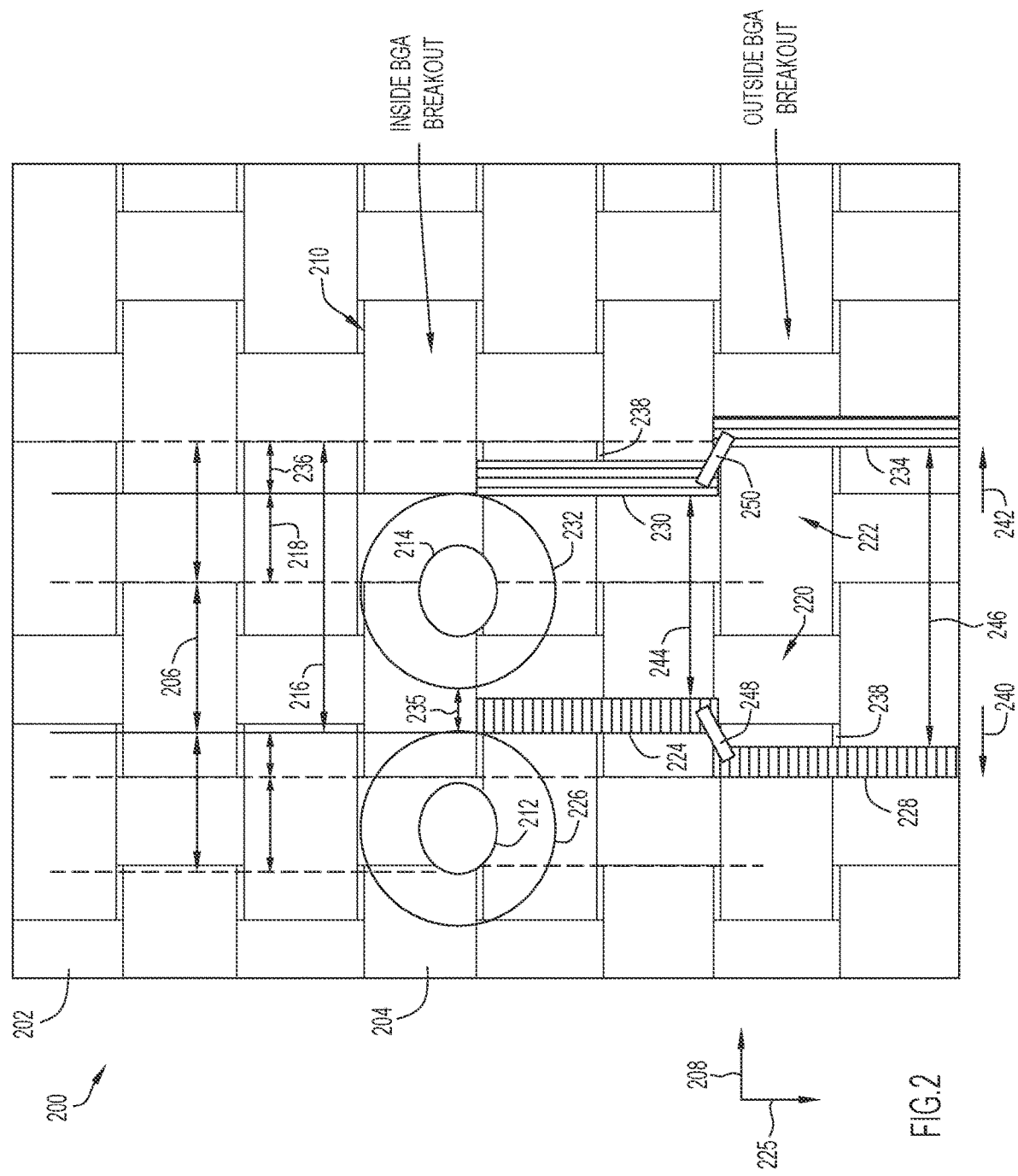
FIG. 2 is a schematic diagram of a PCB layer with traces having trace segments that are offset away from one another, according to one example embodiment.

FIG. 2 is a schematic diagram of a PCB layer 200 composed of a substrate with multiple fiber glass strands (e.g., strings, bundles, fabrics) that are woven together. For example, the substrate of the PCB layer 200 includes first fiber glass strands 202 (e.g., vertical fiber glass strands, thin fiber glass strands) and second fiber glass strands 204 (e.g., horizontal fiber glass strands, thick fiber glass strands) that interweave with one another. It should be noted that although the first fiber glass strands 202 and the second fiber glass strands 204 are oriented perpendicularly relative to one another in the illustrated embodiment, the first fiber glass strands 202 and the second fiber glass strands 204 may be oriented in any other suitable manner, such as at an oblique angle, to interweave with one another. For example, the first fiber glass strands 202 and the second fiber glass strands 204 may be obliquely oriented relative to one another in an additional or alternative embodiment. A filler material, such as resin, may be used to secure the first fiber glass strands 202 and the second fiber glass strands 204 to one another.

The interwoven first fiber glass strands 202 and the second fiber glass strands 204 create a fiber glass weave pattern having a particular period 206 (e.g., 0.47 mm or 18.5 mils), which is a distance along a first axis 208 (e.g., an axis extending along a direction that the second fiber glass strands 204 extend) between centers of adjacent first fiber glass strands 202. Thus, a fiber glass weave pattern that is more tightly interwoven has a smaller period 206, whereas a fiber glass weave pattern that is more loosely interwoven has a greater period 206.

The PCB layer 200 may also include vias that extend therethrough (e.g., through respective first fiber glass strands 202 and/or second fiber glass strands 204). For example, the PCB layer 200 includes a BGA 210 (e.g., a BGA breakout region) with a first via 212 (e.g., a first pin) and a second via 214 (e.g., a second pin) positioned adjacent to one another. The vias 212, 214 may be offset from one another along the first axis 208 to define a pitch 216 (e.g., 0.8 millimeters (mm) or 31.49 thousandths of an inch (mil)) of the BGA 210, or a distance along the first axis 208 between centers of the adjacent vias 212, 214. In the illustrated embodiment, the pitch 216 includes an entire period 206 of the fiber glass weave pattern plus a remainder distance 218 (e.g., 0.33 mm or 12.99 mils) of a portion of an additional period 206 of the fiber glass weave pattern. That is, the pitch 216 may be represented by Equation 1:

$$\text{pitch 216} = \text{period 206} + \text{remainder distance 218} \qquad \text{Equation 1}$$

The PCB layer 200 may further include traces placed over the fiber glass strands 202, 204. Each trace includes multiple trace segments (e.g., cycles) that are offset from one another such that, collectively, the respective trace segments extend along the same layout of the fiber glass weave pattern. For example, a first trace 220 may extend at least partially within a space formed between the vias 212, 214, and an entirety of a second trace 222 may be positioned outside of the space formed between the vias 212, 214. The first trace 220 may include a first trace segment 224 that extends within the BGA 210 (e.g., between the vias 212, 214 along the first axis 208, in overlap with the vias 212, 214 along a second axis 225 along which the first fiber glass strands 202) and adjacent to a first antipad 226 surrounding the first via 212, as well as a second trace segment 228 that is external to the BGA 210 (e.g., offset from the vias 212, 214 along the second axis 225) and offset from and electrically coupled to the first trace segment 224. The second trace 222 may include a third trace segment 230 that extends within the BGA 210 and adjacent to a second antipad 232 surrounding the second via 214, as well as a fourth trace segment 234 that is external to the BGA 210 and offset from and electrically coupled to the third trace segment 230. For example, a space 235 (e.g., 0.14 mm or 5.49 mils) extending between the antipads 226, 232 may be able to accommodate positioning of a trace segment of a single trace therein. In alternative embodiments, the first trace segment 224 may extend adjacent to or from the first via 212 (e.g., the PCB layer 200 may not include the first antipad 226), and/or the fourth trace segment 234 may extend adjacent to or from the second via 214 (e.g., the PCB layer 200 may not include the second antipad 232). Each of the trace segments 224, 228, 230, 234 may extend along the second axis 225.

A first signal may propagate along the first trace 220 via the first trace segment 224 and the second trace segment 228, and a second signal may propagate along the second trace 222 via the third trace segment 230 and the fourth trace segment 234. For instance, the traces 220, 222 may be differential pairs in which the respective signals are of equal magnitude and opposite polarity (e.g., a negative signal, a positive signal). The traces 220, 222 may alternatively be single ended traces in which the signals are an uncoupled differential pair. The first trace segment 224 and the second trace segment 228 may be offset from one another and the third trace segment 230 and the fourth trace segment 234 may be offset from one another such that, collectively, the first trace 220 and the second trace 222 extend along corresponding, common, or similar layouts of the fiber glass weave pattern. Such an arrangement of the traces 220, 222 may cause the traces 220, 222 to have substantially the same overall impedance. As a result, the respective signals may travel at substantially the same speed and/or for substantially the same duration of time to facilitate synchronization of the signals.

By way of example, each of the first trace segment 224 and the fourth trace segment 234 may extend along a portion (e.g., a portion of a length) of a respective first fiber glass strand 202 and a portion (e.g., a width) of a respective second fiber glass strand 204. Additionally, each of the second trace segment 228 and the third trace segment 230 may extend along portions (e.g., widths) of two adjacent second fiber glass strands 204, as well as a space or gap 238 formed between the two adjacent second fiber glass strands 204. Thus, the first trace segment 224 and the second trace segment 228 of the first trace 220 may extend along different layouts of the fiber glass weave pattern and/or the third trace segment 230 and the fourth trace segment 234 of the second trace 222 may extend along different layouts of the fiber glass weave pattern such that the first trace 220 and the second trace 222 may collectively extend along corresponding layouts of the fiber glass weave pattern: a portion of a first fiber glass strand 202, portions of three second fiber glass strands 204, and the space 238 between two adjacent second fiber glass strands 204. As described herein, corresponding, common, or similar layouts (e.g., the same layout) of a fiber glass weave pattern refers to common portions of the same type of fiber glass strand (i.e., the first fiber glass strands 202, the second fiber glass strands 204), and not necessarily common portions of the same fiber glass strand. For example, trace segments that each extend along the entire width of a second fiber glass strand 204 may be considered to extend along corresponding layouts of the fiber glass weave pattern, even though the respective widths may not be of the same exact second fiber glass strand 204. Accordingly, trace segments that extend along common portions of different fiber glass strands, as well as trace segments that extend along common portions of the same fiber glass strand, extend along corresponding layouts of a fiber glass weave pattern. Contrarily, trace segments that extend along different portions a fiber glass strand (e.g., the same fiber glass strand, different fiber glass strands) do not extend along corresponding layouts of a fiber glass weave pattern. For instance, a trace segment that extends along a portion of a first fiber glass strand 202, but not a portion of a second fiber glass strand 204, and a trace segment that extends along a portion of a second fiber glass strand 204, but not a portion of a first fiber glass strand 202, do not extend along corresponding layouts of the fiber glass weave pattern. Similarly, a trace segment that extends along a portion (e.g., an entire width) of a second fiber glass strand 204 and a trace segment that extends along a non-corresponding or dissimilar portion (e.g., half of a width) of the same or a different second fiber glass strand 204 do not extend along corresponding layouts of the fiber glass weave pattern.

To arrange the traces 220, 222 along corresponding layouts of the fiber glass weave pattern, the first trace segment 224 and the second trace segment 228 may be offset from one another along the first axis 208 such that an offset distance 236 (e.g., 0.14 mm or 5.51 mils), which is equal to a difference between the remainder distance 218 and the period 206 of the fiber glass weave pattern, extends between a center of the first trace segment 224 and a center of the second trace segment 228. That is, the offset distance 236 may be represented by Equation 2:

$$\text{offset distance } 236 = \text{period } 206 - \text{remainder distance } 218 \quad \text{Equation 2}$$

The third trace segment 230 and the fourth trace segment 234 may also be offset from one another along the first axis 208 such that the offset distance 236 extends between a center of the third trace segment 230 and a center of the fourth trace segment 234. The second trace segment 228 is offset from the first trace segment 224 along a first direction 240 toward the first via 212, and the fourth trace segment 234 is offset from the third trace segment 230 along a second direction 242, opposite the first direction 240, away from the first via 212 in the illustrated embodiment. That is, the traces 220, 222 are routed away from one another outside of the BGA 210. As a result, the distance along the first axis 208 between the traces 220, 222 may change. For instance, a first distance 244 along the first axis 208 between the first trace segment 224 of the first trace 220 and the third trace segment 230 of the second trace 222 may be less than a second distance 246 between the second trace segment 228 of the first trace 220 and the fourth trace segment 234 of the second trace 222.

The offset distance 236 may be substantially less than the remainder distance 218 and therefore also less than the period 206 of the fiber glass weave pattern and the pitch 216 of the BGA 210. Thus, the spread of the routing of each trace 220, 222 is limited. As an example, an overall space cooperatively defined by the outer boundaries of both traces 220, 222 is significantly reduced by offsetting the trace segments 228, 234 from the trace segments 224, 238, respectively, by the offset distance 236 that is less than the period 206 of the fiber glass weave pattern as compared to offsetting trace segments by an offset distance that is greater than the pitch 216 of the BGA 210. For this reason, a physical footprint occupied by the traces 220, 222 may be reduced, thereby reducing a cost of manufacture (e.g., by reducing material consumption, by limiting a quantity of manufacturing operations to be performed), increasing efficient usage of the PCB layer 200, and/or improving ease of implementation (e.g., by avoiding complicated manufacturing operations) associated with the traces 220, 222, while arranging the traces 220, 222 in a desirable manner to avoid undesirable electrical coupling of the traces 220, 222 with one another, with any of the vias 212, 214, and/or with any other electrical component. Indeed, by reducing the overall space occupied by the traces 220, 222, additional components, such as other traces and/or electrical components, may be incorporated onto the PCB layer 200.

Moreover, because of the offset between the trace segments 224, 228 and between the trace segments 230, 234, there may be a gap formed between the trace segments 224, 228 and between the trace segments 230, 234. In other words, the trace segments 224, 228 may not overlap with one another along the first axis 208, and the trace segments 230, 234 may not overlap with one another along the first axis 208. Therefore, intermediate trace segments may be used to electrically couple the trace segments 224, 228 to one another, as well as to electrically couple the trace segments 230, 234 to one another. By way of example, a first intermediate trace segment 248 may extend from the first trace segment 224 to the second trace segment 228, and a second intermediate trace segment 250 may extend from the third trace segment 230 to the fourth trace segment 234. In some embodiments, the first intermediate trace segment 248 and/or the second intermediate trace segment 250 may extend obliquely relative to the first axis 208 and/or relative to the second axis 225 (e.g., at a 45 degree angle relative to the first axis 208 and/or relative to the second axis 225). In additional or alternative embodiments, the first intermediate trace segment 248 and/or the second intermediate trace segment 250 may extend along the first axis 208.

In certain implementations, the first intermediate trace segment 248 and the second intermediate trace segment 250 may extend along corresponding layouts of the fiber glass weave pattern. As such, the durations of time in which signals travel along the intermediate trace segments 248, 250 may be approximately equal to one another, and the respective overall durations of time of signal travel along the traces 220, 222 are approximately the same. In alternative implementations, the first intermediate trace segment 248 and the second intermediate trace segment 250 may not extend along corresponding layouts of the fiber glass weave pattern. Thus, respective signals may propagate at different speeds along the intermediate trace segments 248, 250, and the respective durations of time in which the signals travel along the intermediate trace segments 248, 250 may be different from one another. However, because of the relatively shorter length of the intermediate trace segments 248, 250 (e.g., in comparison to the trace segments 224, 228, 230, 234), the difference in the durations of time of signal travel along the intermediate trace segments 248, 250 may be relatively insignificant as compared to the overall duration of time of signal travel along the traces 220, 222. For this reason, the respective overall durations of time of signal travel along the traces 220, 222 may substantially match one another even though there may be a difference in the durations of time of signal travel along the intermediate trace segments 248, 250. As such, the arrangement of the intermediate trace segments 248, 250 may not significantly contribute to skew between the traces 220, 222.

Figure 3:
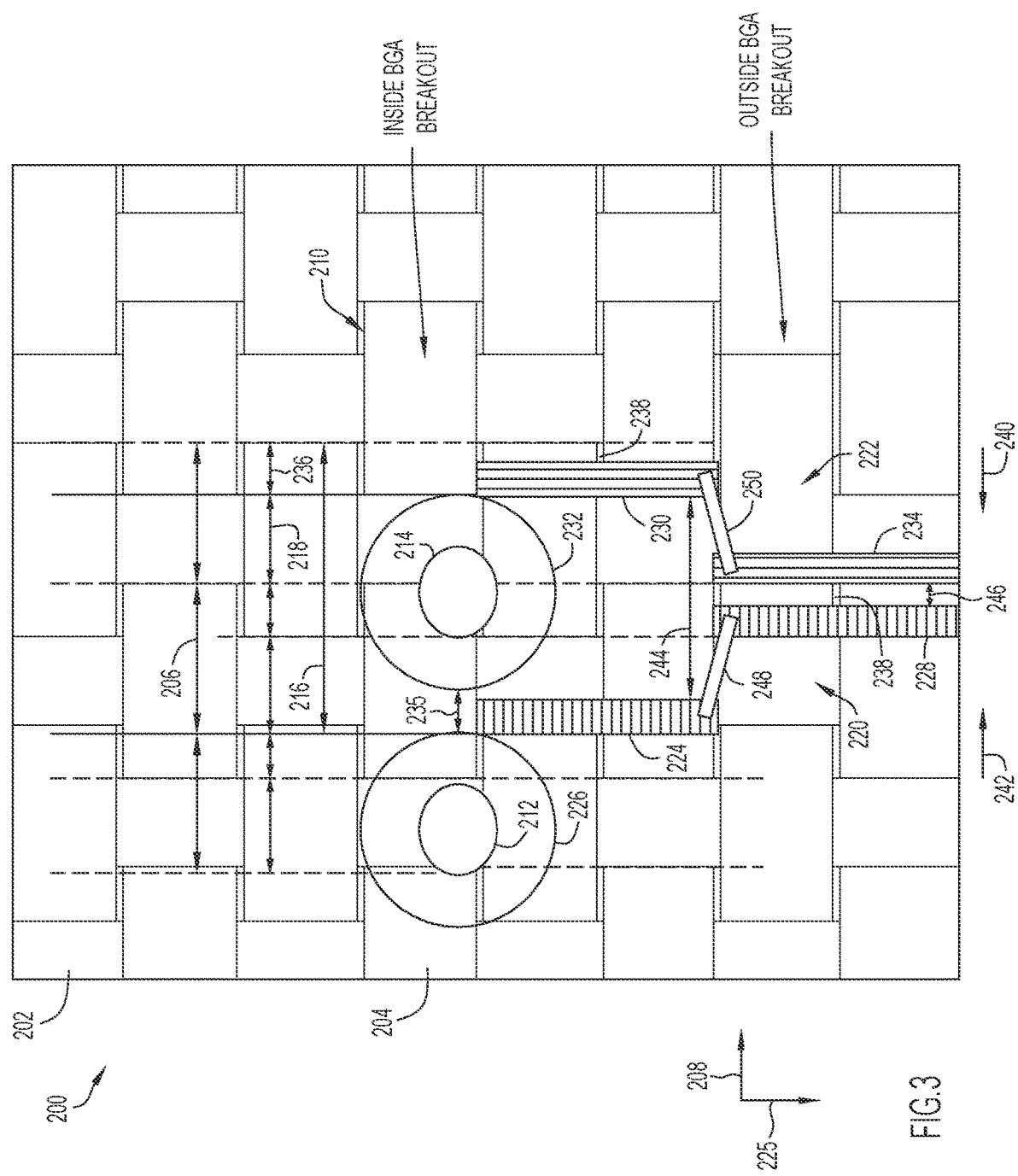
FIG. 3 is a schematic diagram of a PCB layer with traces having trace segments that are offset toward one another, according to another example embodiment.

FIG. 3 is a schematic diagram of the PCB layer 200 in which the traces 220, 222 are routed in a different manner than the embodiment illustrated in FIG. 2. For example, the second trace segment 228 may be offset from the first trace segment 224 along the second direction 242, and the fourth trace segment 234 may be offset from the third trace segment 230 along the first direction 240. That is, the traces 220, 222 are routed toward one another outside of the BGA 210. As such, the first distance 244 between the first trace segment 224 and the third trace segment 230 may be greater than the second distance 246 between the second trace segment 228 and the fourth trace segment 234. Additionally, the second trace segment 228 may be offset from the first trace segment 224 along the first axis 208 such that the remainder distance 218, which may be less than the period 206 of the fiber glass weave pattern and less than the pitch 216 of the BGA 210, extends between a center of the first trace segment 224 and a center of the second trace segment 228, and the third trace segment 230 and the fourth trace segment 234 may also be offset from one another such that the remainder distance 218 extends between a center of the third trace segment 230 and a center of the fourth trace segment 234.

Such an arrangement of the trace segments 224, 228, 230, 234 may also cause the traces 220, 222 to extend along corresponding, common, or similar layouts of the fiber glass weave pattern, thereby reducing skew between the traces 220, 222. Such an arrangement of the trace segments 224, 228, 230, 234 also limits the overall space cooperatively defined by the outer boundaries of both traces 220, 222, while positioning the trace segments 224, 228, 230, 234 in a manner to avoid undesirable electrical coupling of the traces 220, 222 with one another, with any of the vias 212, 214, and/or with any other electrical components.

Figure 4:
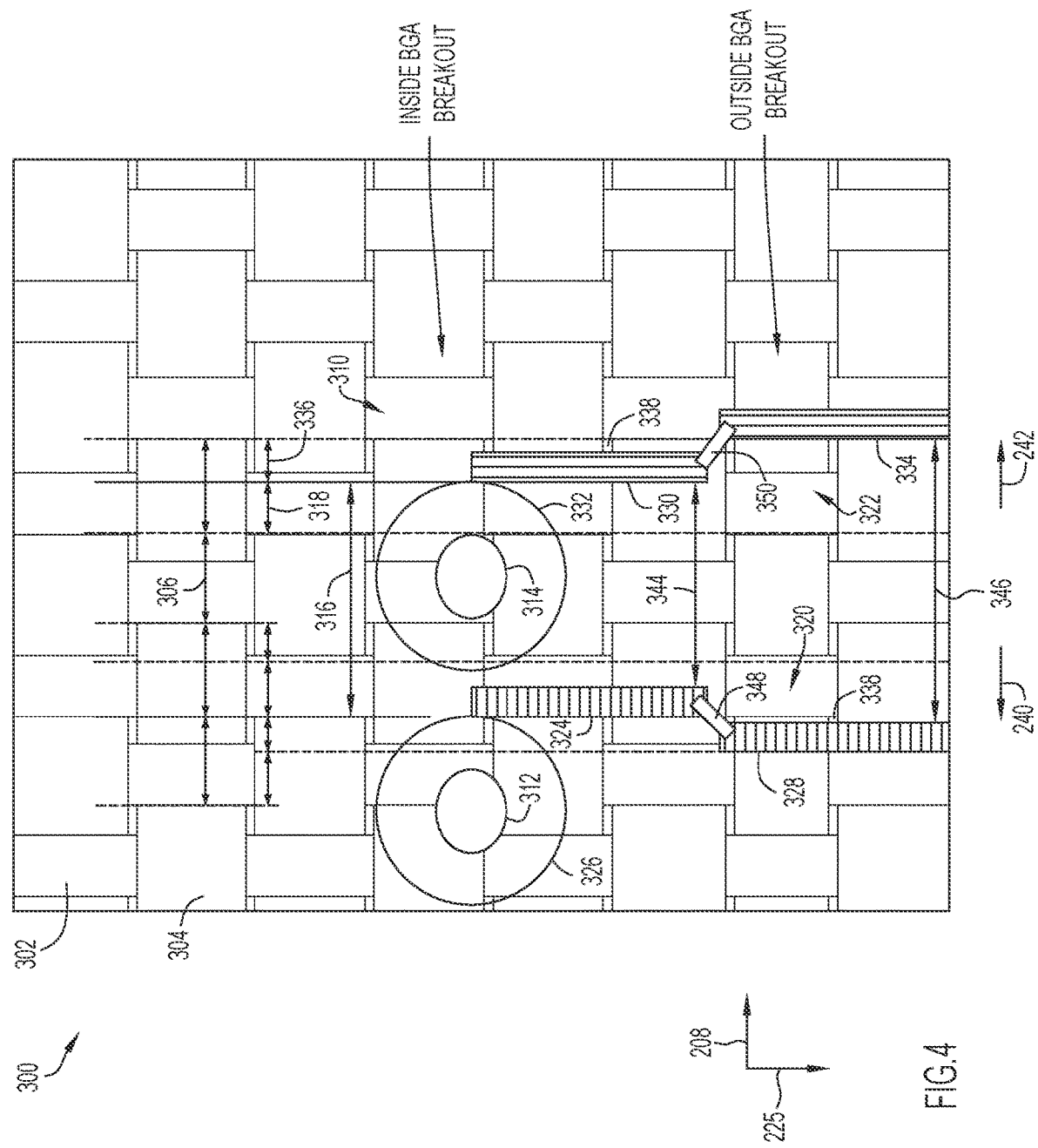
FIG. 4 is a schematic diagram of a PCB layer with traces having trace segments that are offset away from one another, according to yet another example embodiment.

FIG. 4 is a schematic diagram of a PCB layer 300 composed of a substrate with first fiber glass strands 302 and second fiber glass strands 304 woven together to create a fiber glass weave pattern having a period 306 (e.g., 0.36 mm or 14.2 mils). The PCB layer 300 also includes a BGA 310 (e.g., a BGA region) with a first via 312 (e.g., a first pin) and a second via 314 (e.g., a second pin) that are offset from one another to define a pitch 316. In the illustrated embodiment, the pitch 316 includes two entire periods 306 of the fiber glass weave pattern plus a remainder distance 318 (e.g., 0.0785 mm or 3.09 mils) of a portion of an additional period 306 of the fiber glass weave pattern. As an example, the first fiber glass strands 302 and second fiber glass strands 304 may be more tightly woven together such that the period 306 of the fiber glass weave pattern may be less than the period 206 of the fiber glass weave pattern illustrated in FIGS. 2 and 3 to enable the pitch 316 of the BGA 310 to include two entire periods 306 of the fiber glass weave pattern. As another example, the pitch 316 of the BGA 310 may be greater than the pitch 216 of the BGA 210 to enable the pitch 316 of the BGA 310 to include two entire periods 306 of the fiber glass weave pattern. Thus, the illustrated pitch 316 may be represented by Equation 3:

$$\text{pitch } 316 = 2 * \text{period } 306 + \text{remainder distance } 318 \quad \text{Equation 3}$$

The PCB layer 300 further includes a first trace 320 that may extend between the vias 312, 314 along the first axis 208, as well as a second trace 322 that may be positioned outside of the vias 312, 314 along the first axis 208. The first trace 320 may include a first trace segment 324 that extends within the BGA 310 (e.g., between the vias 312, 314 along the first axis 208, in overlap with the vias 312, 314 along the second axis 225) and adjacent to a first antipad 326 surrounding the first via 312, as well as a second trace segment 328 that is external to the BGA 310 (e.g., offset from the vias 312, 314 along the second axis 225) and offset from and electrically coupled to the first trace segment 324. The second trace 322 may include a third trace segment 330 that extends within the BGA 310 and adjacent to a second antipad 323 surrounding the second via 314, as well as a fourth trace segment 334 that is external to the BGA 310 and offset from and electrically coupled to the third trace segment 330. Each of the trace segments 324, 328, 330, 334 may extend along the second axis 225. The traces 320, 322 may be differential pairs or single ended traces.

The first trace segment 324 and the second trace segment 328 may be offset from one another and the third trace segment 330 and the fourth trace segment 334 may be offset from one another such that, collectively, the first trace 320 and the second trace 322 extend along corresponding, common, or similar layouts of the fiber glass weave pattern, thereby reducing skew between the traces 320, 322. By way of example, the first trace segment 324 and the second trace segment 328 may be offset from one another in the first direction 240 along the first axis 208 such that an offset distance 336 (e.g., 0.282 mm or 11.11 mils), which is equal to a difference between the remainder distance 318 and the period 306 of the fiber glass weave pattern, extends between a center of the first trace segment 324 and a center of the second trace segment 328. That is, the offset distance 336 may be represented by Equation 4, which may be similar to Equation 2 described herein:

$$\text{offset distance } 336 = \text{period } 306 - \text{remainder distance } 318 \quad \text{Equation 4}$$

The third trace segment 330 and the fourth trace segment 334 may also be offset from one another in the second direction 242 along the first axis 208 such that the offset distance 336 extends between a center of the third trace segment 330 and a center of the fourth trace segment 334. As such, the traces 320, 322 are routed away from one another outside of the BGA 210 such that a first distance 344 along the first axis 208 between the first trace segment 324 and the third trace segment 330 may be less than a second distance 346 between the second trace segment 328 and the fourth trace segment 334. The offset distance 336 may be substantially less than the period 306 of the fiber glass weave pattern and the pitch 316 of the BGA 310 to limit the spread of the routing of each trace 320, 322 and of the overall space cooperatively defined by the outer boundaries of both traces 320, 322. Thus, a physical footprint occupied by the traces 320, 322 may be reduced.

The illustrated arrangement of the trace segments 324, 328, 330, 334 may cause each of the first trace segment 324 and the fourth trace segment 334 to extend along a portion (e.g., a portion of a length) of a respective first fiber glass strand 302 and a portion (e.g., a width) of a respective second fiber glass strand 304 and may cause each of the second trace segment 328 and the third trace segment 330 to extend along portions (e.g., widths) of two adjacent second fiber glass strands 304, as well as a space or gap 338 formed between the two adjacent second fiber glass strands 304. As such, each of the first trace 320 and the second trace 322 may extend along corresponding, common, or similar layouts of the fiber glass weave pattern: a portion of a first fiber glass strand 302, portions of three second fiber glass strands 304, and the space 338 between two adjacent second fiber glass strands 304.

Additionally, a first intermediate trace segment 348 may extend (e.g., obliquely relative to the first axis 208 and/or relative to the second axis 225, along the first axis 208) from the first trace segment 324 to the second trace segment 328 to electrically couple the trace segments 324, 328 to one another. A second intermediate trace segment 350 may extend (e.g., obliquely relative to the first axis 208 and/or relative to the second axis 225, along the first axis 208) from the third trace segment 330 to the fourth trace segment 334 to electrically couple the trace segments 330, 334 to one another.

It should be noted that similar techniques described herein may be implemented in any suitable substrate configuration of a PCB. For example, trace segments may be routed along a fiber glass weave pattern in which a pitch of a BGA of the PCB contains any suitable quantity (e.g., three or more) of periods of the fiber glass weave pattern. Moreover, the trace segments may be fractionally offset in any suitable manner to cause respective traces to extend along corresponding, common, or similar layouts of the fiber glass weave pattern.

Figure 5:
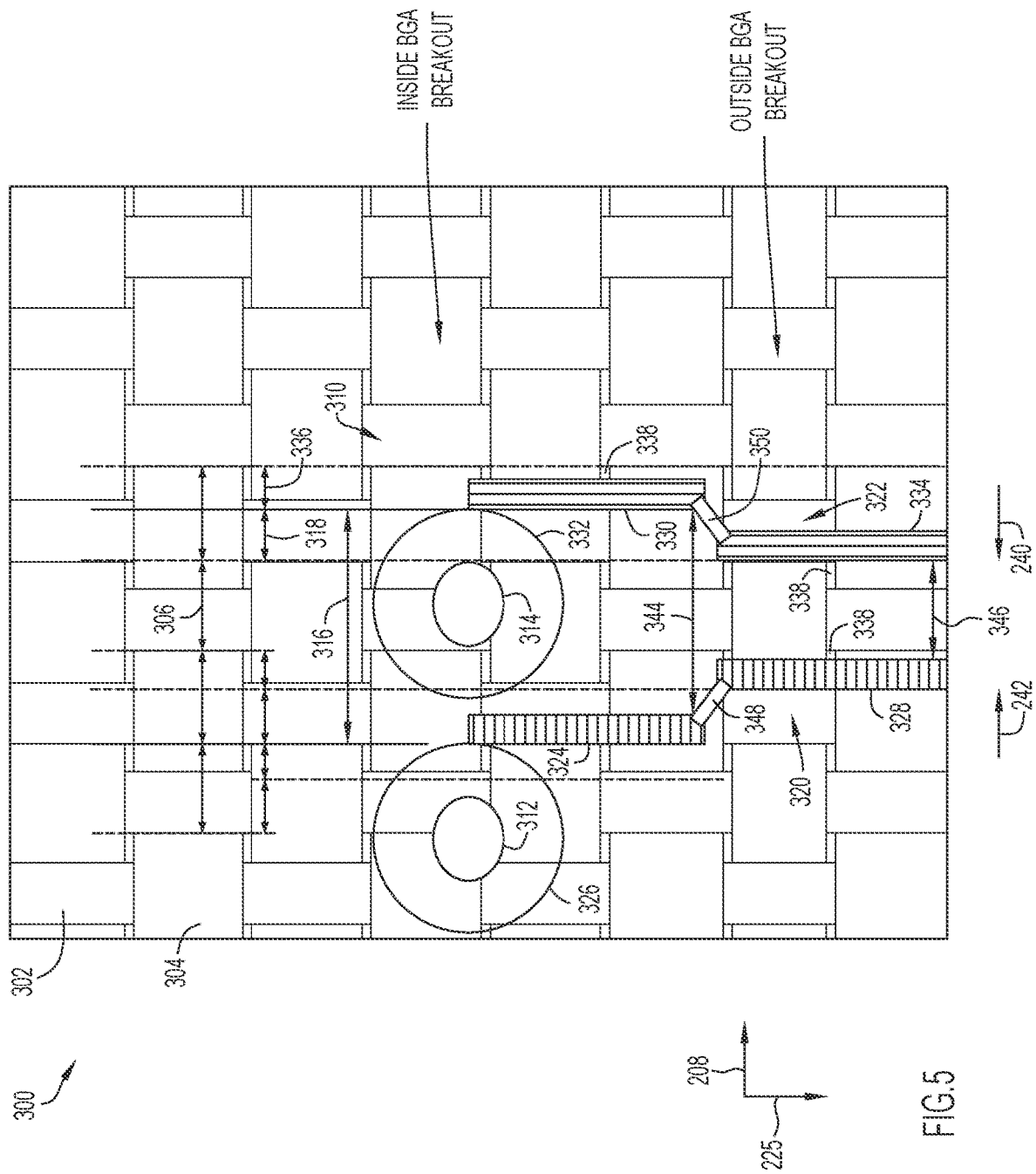
FIG. 5 is a schematic diagram of a PCB layer with traces having trace segments that are offset toward one another, according to still another example embodiment.

FIG. 5 is a schematic diagram of the PCB layer 300 in which the traces 320, 322 are routed in a different manner than the embodiment illustrated in FIG. 4. For example, the second trace segment 328 may be offset from the first trace segment 324 along the second direction 242, and the fourth trace segment 334 may be offset from the third trace segment 330 along the first direction 240 to route the traces 320, 322 toward one another outside of the BGA 310. Thus, the first distance 344 between the first trace segment 324 and the third trace segment 330 may be greater than the second distance 346 between the second trace segment 328 and the fourth trace segment 334. The second trace segment 328 may be offset from the first trace segment 324 along the first axis 208 such that the remainder distance 318, which may be less than the period 306 of the fiber glass weave pattern and less than the pitch 316 of the BGA 310, extends between a center of the first trace segment 324 and a center of the second trace segment 328, and the third trace segment 330 and the fourth trace segment 334 may be offset from one another such that the remainder distance 318 extends between a center of the third trace segment 330 and a center of the fourth trace segment 334. As a result, the traces 320, 322 may extend along corresponding, common, or similar layouts of the fiber glass weave pattern, thereby reducing skew between the traces 320, 322, while limiting the overall space cooperatively defined by the outer boundaries of both traces 320, 322 and positioning the trace segments 324, 328, 330, 334 in a manner to avoid undesirable electrical coupling of the traces 320, 322 with one another, with any of the vias 312, 314, and/or with any other electrical components.

Although each of the traces 220, 222, 320, 322 of FIGS. 2-5 include two trace segments that are offset from one another to reduce skew, it should be noted that the traces 220, 222, 320, 322 may include any suitable number of trace segments that are aligned or offset from one another to reduce skew. Indeed, traces may include more than two trace segments and more than one offset between trace segments, and any of the trace segments may extend within the BGA or external to the BGA.

Figure 6:
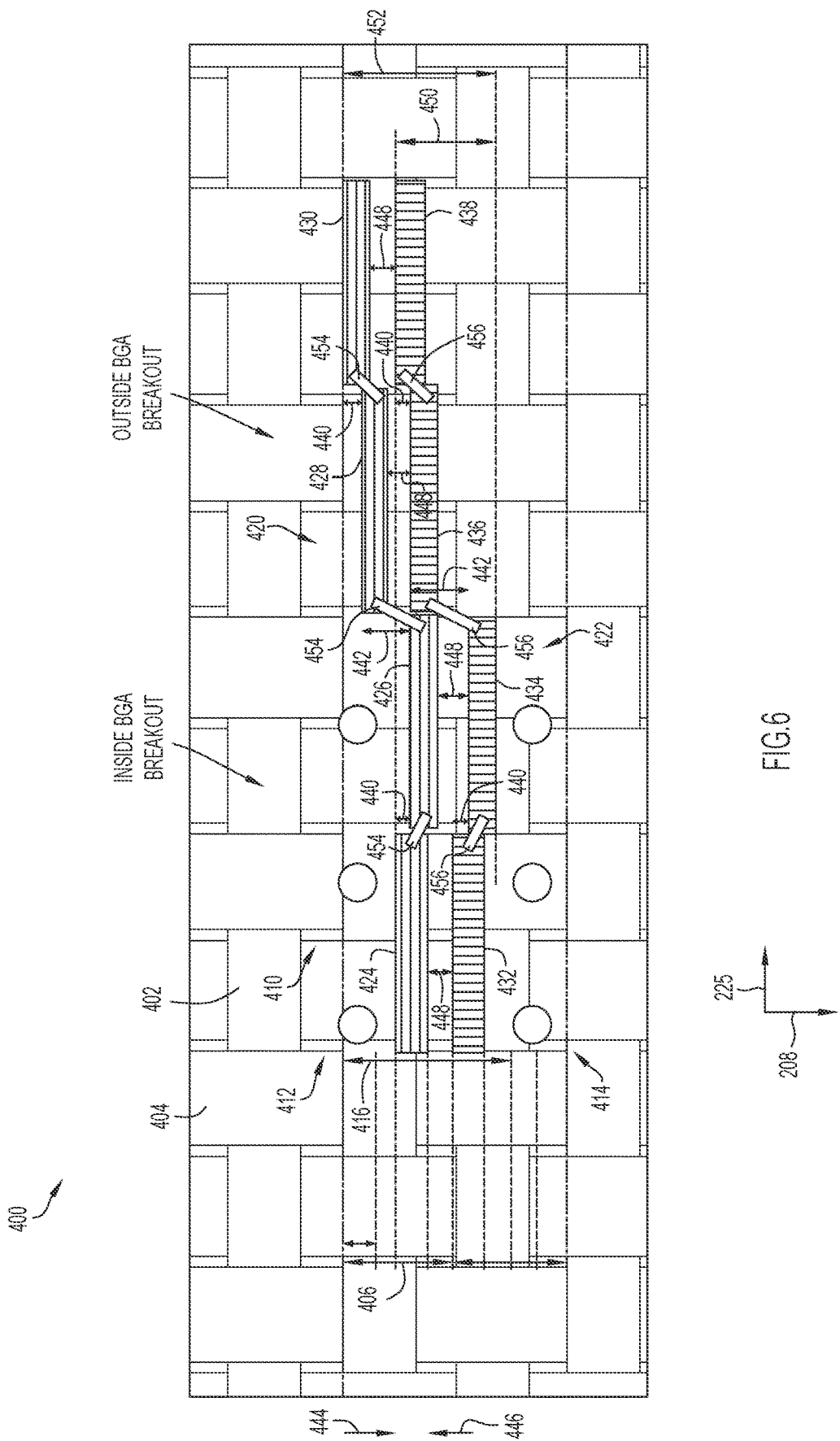
FIG. 6 is a schematic diagram of a PCB layer with traces having trace segments that are offset together, according to one example embodiment.

FIG. 6 is a schematic diagram of a PCB layer 400 composed of a substrate with first fiber glass strands 402 and second fiber glass strands 404 woven together to create a fiber glass weave pattern having a period 406 (e.g., 0.36 mm or 14.2 mils) extending along the first axis 208. The PCB layer 400 may include a BGA 410 (e.g., a BGA region) with a first distribution 412 (e.g., a first row, a first column) of vias (e.g., pins, antipads) along the second axis 225 and a second distribution 414 (e.g., a second row, a second column) of vias (e.g., pins, antipads) along the second axis 225. The first distribution 412 of vias and the second distribution 414 of vias may be offset from one another to define a pitch 416 (e.g., 1 mm) extending along the first axis 208. The pitch 416 may include one entire period 406 of the fiber glass weave pattern.

The PCB layer 400 may also include a first trace 420 and a second trace 422, which may extend alongside one another between the first distribution 412 of vias and the second distribution 414 of vias. That is, the pitch 416 may be large enough and/or the thickness of the traces 420, 422 may be small enough to accommodate positioning of both traces 420, 422 between adjacent vias along the first axis 208. For example, in embodiments in which antipads surround vias, there may be 0.34 mm or 13.37 mils of available space along the first axis 208 in which the traces 420, 422 may be positioned between the antipads. Each trace 420, 422 may include multiple trace segments extending within the BGA 410 (e.g., at least partially between the distributions 412, 414 of vias along the first axis 208, at least partially in overlap with the distributions 412, 414 of vias along the second axis 225) and multiple segments extending outside of the BGA 410 (e.g., offset from the distributions 412, 414 of vias along the second axis 225). By way of example, the first trace 420 may include a first trace segment 424 and a second trace segment 426 that extend along the second axis 225 within the BGA 410, as well as a third trace segment 428 and a fourth trace segment 430 that extend along the second axis 225 outside of the BGA 410. The second trace 422 may include a fifth trace segment 432 and a sixth trace segment 434 that extend along the second axis 225 within the BGA 410, as well as a seventh trace segment 436 and an eighth trace segment 438 that extend along the second axis 225 outside of the BGA 410. The traces 420, 422 may be differential pairs or single ended traces.

The first trace segment 424, the second trace segment 426, the third trace segment 428, and the fourth trace segment 430 may be offset from one another and the fifth trace segment 432, the sixth trace segment 434, the seventh trace segment 436, and the eighth trace segment 438 may be offset from one another such that, collectively, the first trace 420 and the second trace 422 extend along corresponding, common, or similar layouts of the fiber glass weave pattern, thereby reducing skew between the traces 420, 422. In the illustrated embodiment, the first trace segment 424 and the second trace segment 426 of the first trace 420 are offset from one another along the first axis 208 such that a first offset distance 440, which may be equal to ⅛ of the period 406 of the fiber glass weave pattern, extends between a center of the first trace segment 424 and a center of the second trace segment 426. The fifth trace segment 432 and the sixth trace segment 434 of the second trace 422 may be offset from one another along the first axis 208 such that the first offset distance 440 also extends between a center of the fifth trace segment 432 and a center of the sixth trace segment 434. The second trace segment 426 and the third trace segment 428 of the first trace 420 may be offset from one another along the first axis 208 such that a second offset distance 442, which may be equal to half of the period 406 of the fiber glass weave pattern, extends between a center of the second trace segment 426 and a center of the third trace segment 428. The sixth trace segment 434 and the seventh trace segment 436 of the second trace 422 may be offset from one another such that the second offset distance 442 also extends between a center of the sixth trace segment 434 and a center of the seventh trace segment 436. The third trace segment 428 and the fourth trace segment 430 of the first trace 420 may be offset from one another along the first axis 208 such that the first offset distance 440 extends between a center of the third trace segment 428 and a center of the fourth trace segment 430. The seventh trace segment 436 and the eighth trace segment 438 of the second trace 422 may be offset from one another along the first axis 208 such that the first offset distance 440 also extends between a center of the seventh trace segment 436 and a center of the eighth trace segment 438. The offset distances 440, 442 between adjacent trace segments 424, 426, 428, 430, 432, 434, 436, 438 may therefore be substantially less than the period 406 of the fiber glass weave pattern and less than the pitch 416 of the BGA 410.

The traces 420, 422 may be routed alongside one another. In other words, the offsets of the trace segments 424, 426, 428, 430 of the first trace 420 may be in the same direction as the corresponding offsets of the trace segments 432, 434, 436, 438 of the second trace 422. For example, the second trace segment 426 may be offset from the first trace segment 424 in a first direction 444 (e.g., toward the second distribution 414 of vias, away from the first distribution 412 of vias), and the fifth trace segment 432 may also be offset from the sixth trace segment 434 in the first direction 444. The third trace segment 428 may be offset from the second trace segment 426 in a second direction 446 (e.g., toward the first distribution 412 of vias, away from the second distribution 414 of vias), opposite the first direction 444, and the seventh trace segment 436 may also be offset from the sixth trace segment 434 in the second direction 446. The fourth trace segment 430 may be offset from the third trace segment 428 in the second direction 446, and the eighth trace segment 438 may also be offset from the seventh trace segment 436 in the second direction 446. In this manner, a distance 448 (e.g., ¼ of the period 406 of the fiber glass weave pattern) along the first axis 208 between the traces 420, 422 may be maintained. That is, the first trace segment 424 and the fifth trace segment 432 may be offset from one another by the distance 448, the second trace segment 426 and the sixth trace segment 434 may be offset from one another by the distance 448, the third trace segment 428 and the seventh trace segment 436 may be offset from one another by the distance 448, and the fourth trace segment 430 and the eighth trace segment 438 may be offset from one another by the distance 448. Such an offset between the traces 420, 422 may avoid undesirable electrical coupling between the traces 420, 422.

In the illustrated arrangement, the first trace segment 424 of the first trace 420 and the eighth trace segment 438 of the second trace 422 extend along corresponding layouts of the fiber glass weave pattern, the second trace segment 426 of the first trace 420 and the seventh trace segment 436 of the second trace 422 extend along corresponding layouts of the fiber glass weave pattern, the third trace segment 428 of the first trace 420 and the sixth trace segment 434 of the second trace 422 extend along corresponding layouts of the fiber glass weave pattern, and the fourth trace segment 430 of the first trace 420 and the fifth trace segment 432 of the second trace 422 extend along corresponding layouts of the fiber glass weave pattern. The first trace segment 424, the second trace segment 426, the third trace segment 428, and the fourth trace segment 430 of the first trace may extend along different layouts of the fiber glass weave pattern and/or the fifth trace segment 432, the sixth trace segment 434, the seventh trace segment 436, and the eighth trace segment 438 of the second trace 422 may extend along different layouts of the fiber glass weave pattern, whereas the first trace 420 and the second trace 422 collectively extend along corresponding layouts of the fiber glass weave pattern.

In addition to arranging the first trace 420 and the second trace 422 to extend along corresponding, common, or similar layouts of the fiber glass weave pattern, the arrangement of the first trace 420 and of the second trace 422 may also avoid undesirable electrical coupling between the traces 420, 422 and the vias or any other electrical component of the PCB layer 400. For example, even though the traces 420, 422 are routed closer toward the second distribution 414 of vias from the first trace segment 424 to the second trace segment 426 and from the fifth trace segment 432 to the sixth trace segment 434, the first offset distance 440 between the first trace segment 424 and the second trace segment 426 and between the fifth trace segment 432 and the sixth trace segment 434 may be sufficiently small to position the traces 420, 422 away from the second distribution 414 of vias such that the traces 420, 422 are not electrically coupled to the second distribution 414 of vias. Indeed, a BGA trace distance 450 along the first axis 208 occupied by the traces 420, 422 (e.g., from the first trace segment 424 of the first trace 420 to the sixth trace segment 434 of the second trace 422) within the BGA 410 may be limited. In particular, the BGA trace distance 450, which may be dependent on the thickness or width of each trace segment, is less than the available space (e.g., 0.34 mm or 13.37 mils) along the first axis 208 between the vias. For instance, the BGA trace distance 450 may be equal to about ⅞ of the period 406 (e.g., the BGA trace distance 450 is equal to 0.316 mm or 12.42 mils) of the fiber glass weave pattern for trace segments that have a thickness of ¼ of the period 406 of the fiber glass weave pattern and for traces separated by the distance 448 of ¼ of the period 406 therebetween.

Such routing of the traces 420, 422 may further limit an overall space cooperatively defined by the outer boundaries of both traces 420, 422. For example, routing the traces 420, 422 to offset in both the first direction 444 and the second direction 446 may limit the overall space as compared to routing the traces 420, 422 to offset in a single one of the first direction 444 or the second direction 446. That is, an overall trace distance 452 along the first axis 208 occupied by the combination of traces 420, 422 (e.g., from the sixth trace segment 434 of the second trace 422 to the fourth trace segment 430 of the second trace 420) may be limited. The overall trace distance 452 may, for example, be equal to approximately ¹¹⁄₈ of the period 406 (e.g., the overall trace distance 452 is equal to 0.5 mm or 19.5 mils) of the fiber glass weave pattern for trace segments that have a thickness of ¼ of the period 406 of the fiber glass weave pattern.

The first trace 420 may include first intermediate trace segments 454 that electrically couple the trace segments 424, 426, 428, 430 to one another, and the second trace 422 may include second intermediate trace segments 456 that electrically couple the trace segments 432, 434, 436, 438 to one another. The first intermediate trace segments 454 and the second intermediate trace segments 456 may extend in any suitable manner, such as along the second axis 225, along the first axis 208, and/or obliquely relative to the first axis 208 and/or relative to the second axis 225. In additional or alternative embodiments, certain trace segments may be electrically coupled to one another without intermediate trace segments 454, 456. By way of example, the first trace segment 424 and the second trace segment 426 may overlap with one another along the first axis 208, the third trace segment 428 and the fourth trace segment 430 may overlap with one another along the first axis 208, the fifth trace segment 432 and the sixth trace segment 434 may overlap with one another along the first axis 208, and/or the seventh trace segment 436 and the eighth trace segment 438 may overlap with one another along the first axis 208. For this reason, the first trace segment 424 and the second trace segment 426, the third trace segment 428 and the fourth trace segment 430, the fifth trace segment 432 and the sixth trace segment 434, and/or the seventh trace segment 436 and the eighth trace segment 438 may be placed in direct contact with one another to electrically couple to one another.

It should be noted that the first intermediate trace segments 454 may have different lengths from one another to electrically couple the trace segments 424, 426, 428, 430 to one another and/or the second intermediate trace segments 456 may have different lengths from one another to electrically couple the trace segments 432, 434, 436, 438 to one another. As an example, because of the relatively greater offset between the second trace segment 426 and the third trace segment 428, and similarly a relatively greater offset between the sixth trace segment 434 and the seventh trace segment 436, the first intermediate trace segment 454 extending from the second trace segment 426 to the third trace segment 428, as well as the second intermediate trace segment 456 extending from the sixth trace segment 434 to the seventh trace segment 436, may be relatively longer. As another example, because of the relatively smaller offset between the first trace segment 424 and the second trace segment 426, and similarly a relatively smaller offset between the fifth trace segment 432 and the sixth trace segment 434, the first intermediate trace segment 454 extending from the first trace segment 424 to the second trace segment 426, as well as the second intermediate trace segment 456 extending from the fifth trace segment 432 to the sixth trace segment 434, may be relatively shorter. Additionally or alternatively, the first intermediate trace segments 454 may be oriented differently (at different angles) relative to one another to electrically couple the trace segments 424, 426, 428, 430 to one another and/or the second intermediate trace segments 456 may be oriented differently relative to one another to electrically couple the trace segments 432, 434, 436, 438 to one another. Indeed, the intermediate trace segments 454, 456 may be arranged in any suitable manner to electrically couple the respective trace segments 424, 426, 428, 430, 432, 434, 436, 438 to one another.

Figure 7:
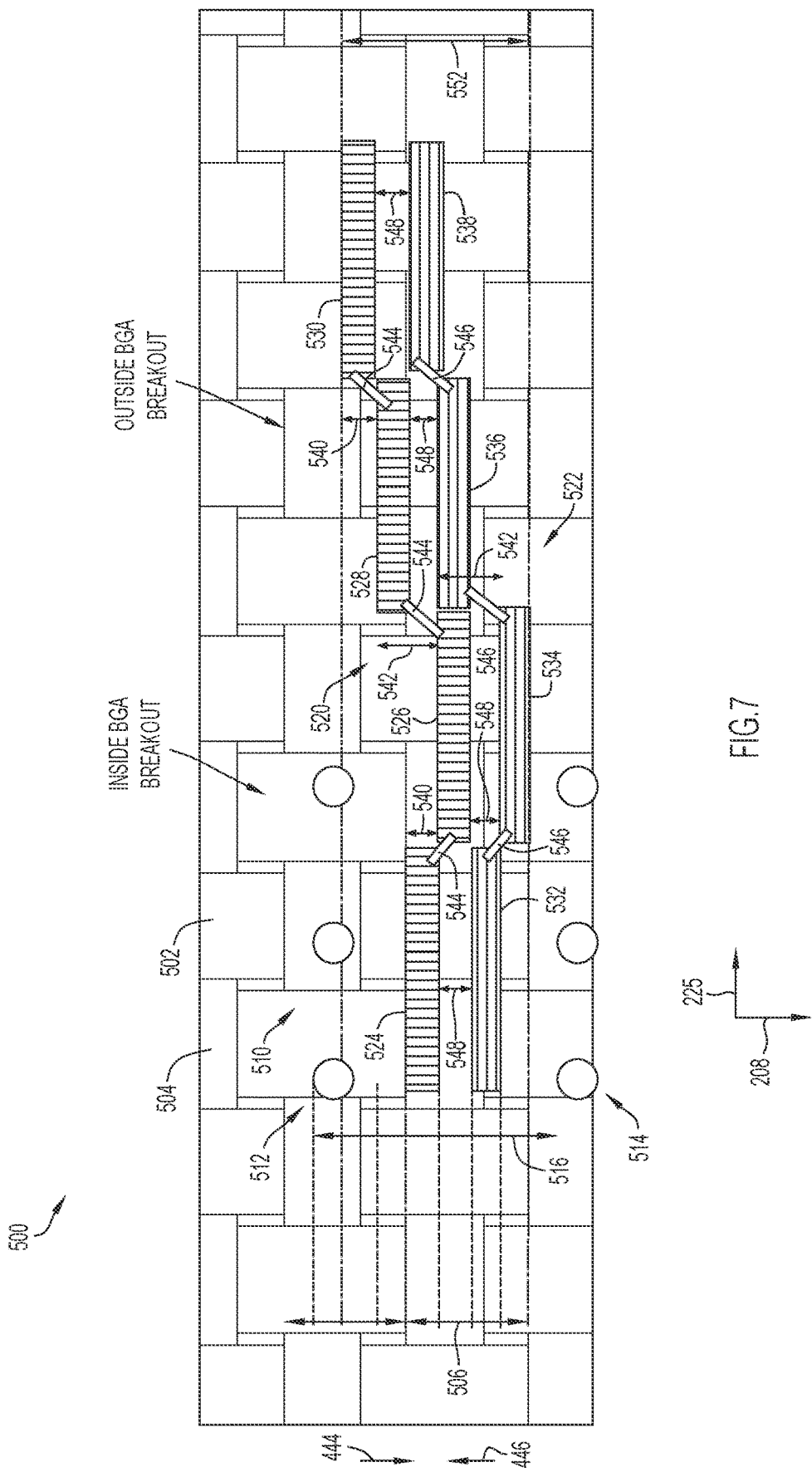
FIG. 7 is a schematic diagram of a PCB layer with traces having trace segments that are offset together, according to another example embodiment.

FIG. 7 is a schematic diagram of a PCB layer 500 composed of a substrate with first fiber glass strands 502 and second fiber glass strands 504 woven together to create a fiber glass weave pattern having a period 506 extending along the first axis 208. The PCB layer 500 may include a BGA 510 (e.g., a BGA region) with a first distribution 512 (e.g., a first row, a first column) of vias (e.g., pins, antipads) along the second axis 225 and a second distribution 514 of vias (e.g., pins, antipads) offset from one another to define a pitch 516 extending along the first axis 208. The pitch 516 may include two entire periods 506 of the fiber glass weave pattern. For instance, the fiber glass strands 502, 504 may be more tightly woven together such that the period 506 of the fiber glass weave pattern may be less than the period 406 of the fiber glass weave pattern illustrated in FIG. 6 to enable the pitch 516 of the BGA 510 to include two entire periods 506 of the fiber glass weave pattern. Additionally or alternatively, the pitch 516 of the BGA 510 may be greater than the pitch 416 of the BGA 410 to enable the pitch 516 of the BGA 510 to include two entire periods 506 of the fiber glass weave pattern.

The PCB layer 500 may include a first trace 520 and a second trace 522 that may extend alongside one another between the first distribution 512 of vias and the second distribution 514 of vias. The first trace 520 may include a first trace segment 524 and a second trace segment 526 that extend along the second axis 225 within the BGA 510, as well as a third trace segment 528 and a fourth trace segment 530 that extend along the second axis 225 outside of the BGA 510. The second trace 522 may include a fifth trace segment 532 and a sixth trace segment 534 that extend along the second axis 225 within the BGA 510, as well as a seventh trace segment 536 and an eighth trace segment 538 that extend along the second axis 225 outside of the BGA 510. The traces 520, 522 may be differential pairs or single ended traces.

The first trace segment 524, the second trace segment 526, the third trace segment 528, and the fourth trace segment 530 may be offset from one another and the fifth trace segment 532, the sixth trace segment 534, the seventh trace segment 536, and the eighth trace segment 538 may be offset from one another such that, collectively, the first trace 520 and the second trace 522 extend along corresponding, common, or similar layouts of the fiber glass weave pattern. Additionally, the traces 520, 522 may be routed alongside one another such that the offsets of the trace segments 524, 526, 528, 530 of the first trace 520 may be in the same direction as the corresponding offsets of the trace segments 532, 534, 536, 538 of the second trace 522. For example, the first trace segment 524 may be offset from the second trace segment 526 in the first direction 444 along the first axis 208 such that a first offset distance 540, which may be equal to ¼ of the period 506 of the fiber glass weave pattern, extends between a center of the first trace segment 524 and a center of the second trace segment 526. The fifth trace segment 532 may be offset from the sixth trace segment 534 in the first direction 444 along the first axis 208 such that the first offset distance 540 also extends between a center of the fifth trace segment 532 and a center of the sixth trace segment 534. The second trace segment 526 may be offset from the third trace segment 528 of the first trace 520 in the second direction 446 along the first axis 208 such that a second offset distance 542, which may be equal to half of the period 506 of the fiber glass weave pattern, extends between a center of the second trace segment 526 and a center of the third trace segment 528. The sixth trace segment 534 may be offset from the seventh trace segment 536 in the second direction 446 such that the second offset distance 542 also extends between a center of the sixth trace segment 534 and a center of the seventh trace segment 536. The third trace segment 528 may be offset from the fourth trace segment 530 in the second direction 446 along the first axis 208 such that the first offset distance 540 extends between a center of the third trace segment 528 and a center of the fourth trace segment 530. The seventh trace segment 536 may be offset from the eighth trace segment 538 in the second direction 446 along the first axis 208 such that the first offset distance 540 also extends between a center of the seventh trace segment 536 and a center of the eighth trace segment 538. The offset distances 540, 542 between adjacent trace segments 524, 526, 528, 530, 532, 534, 536, 538 may therefore be substantially less than the period 506 of the fiber glass weave pattern and less than the pitch 516 of the BGA 510, and a distance 548 (e.g., ¼ of the period 506 of the fiber glass weave pattern) along the first axis 208 between the traces 520, 522 may be maintained.

First intermediate trace segments 544 may electrically couple the first trace segment 524, the second trace segment 526, the third trace segment 528, and/or the fourth trace segment 530 to one another. Second intermediate trace segments 546 may electrically couple the fifth trace segment 532, the sixth trace segment 534, the seventh trace segment 536, and/or the eighth trace segment 538 to one another. In additional or alternative embodiments, any of the trace segments 524, 526, 528, 530, 532, 534, 536, 538 may be coupled to one another without intermediate trace segments, such as by directly contacting one another.

The increased size of the pitch 516 of the BGA 510 relative to the period 506 of the fiber glass weave pattern may enable greater offsets between trace segments within the BGA 510 without causing undesirable electrical couplings between the first trace 520, the second trace 522, and the vias. As an example, the first offset distance 540 between the first trace segment 524 and the second trace segment 526 or between the fifth trace segment 532 and the sixth trace segment 534 for the PCB layer 500, in which the pitch 516 is greater than two entire periods 506, is greater than the first offset distance 440 between the first trace segment 424 and the second trace segment 426 or between the fifth trace segment 432 and the sixth trace segment 434 for the PCB layer 400, in which the pitch 416 is greater than one entire period 406. Additionally, for such an arrangement of the traces 520, 522, an overall trace distance 552 along the first axis 208 occupied by the combination of traces 520, 522 (e.g., from the sixth trace segment 534 of the second trace 522 to the fourth trace segment 530 of the second trace 522) may be equal to, as an example, approximately ½ of the period 506 of the fiber glass weave pattern for trace segments that have a thickness of ¼ of the period 506 of the fiber glass weave pattern and traces separated by the distance 548 of ¼ of the period 506 of the fiber glass weave pattern therebetween. Thus, the overall trace distance 552 may be greater than the overall trace distance 452 of the PCB layer 400. In this manner, increased offsets of trace segments within the BGA 510 may increase the overall trace distance 552 occupied by the traces 520, 522 to arrange the traces 520, 522 to extend along corresponding, common, or similar layouts of the fiber glass weave pattern.

Although each of the traces 420, 422, 520, 522 of FIGS. 6 and 7 includes four trace segments, any of the traces 420, 422, 520, 522 may include any suitable number of trace segments that are aligned or offset from one another to reduce skew. Such trace segments may also be positioned in any suitable manner relative to a corresponding BGA. By way of example, one trace segment or more than two trace segments may be positioned within the BGA. Moreover, any of the respective trace segments may be offset in opposite directions along the first axis 208 in certain embodiments.

Figure 8:
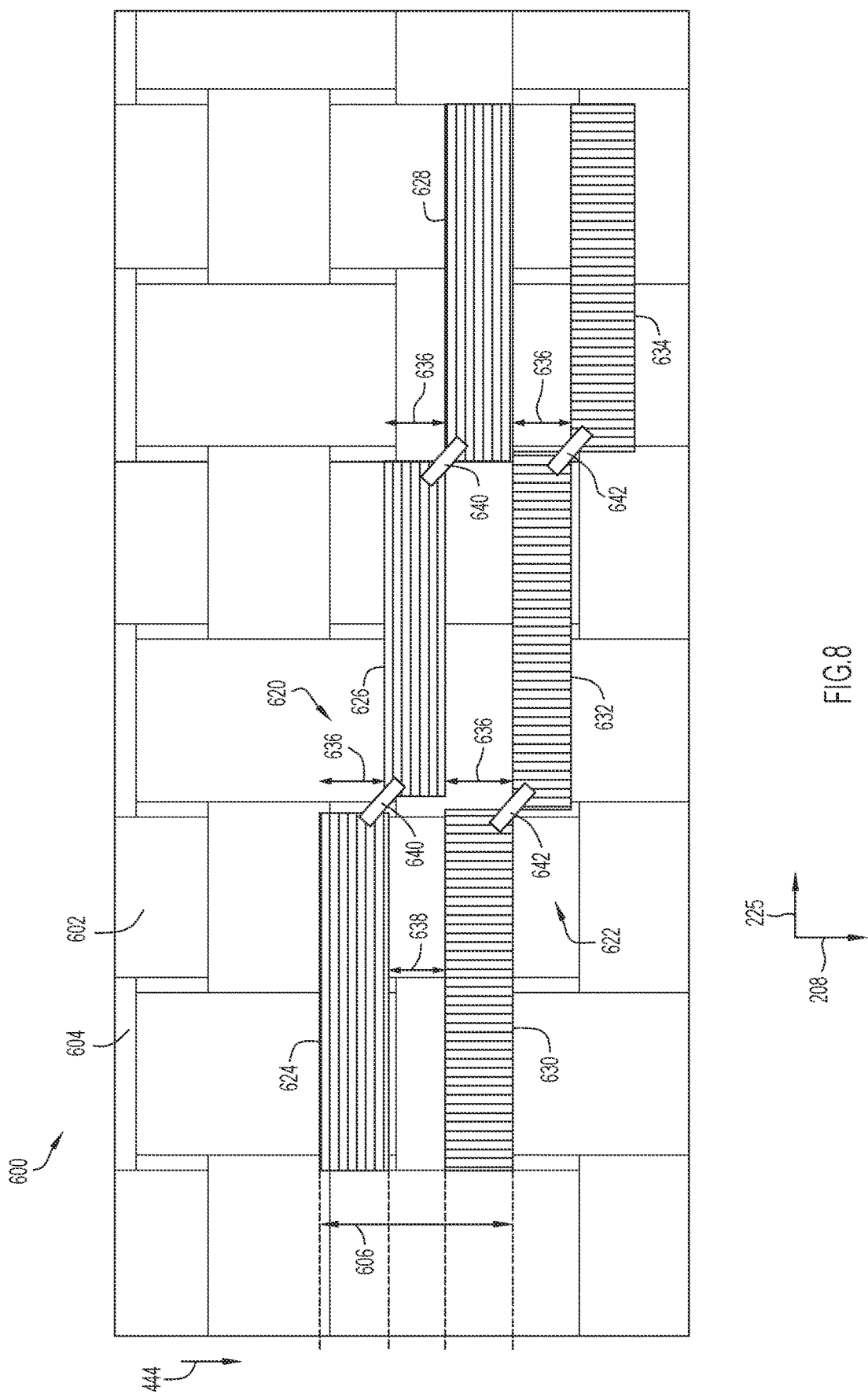
FIG. 8 is a schematic diagram of a PCB layer with traces having trace segments that are offset together, according to still another example embodiment.

Indeed, trace segments may be offset from one another in any suitable manner to extend the traces along corresponding, common, or similar layouts of a fiber glass weave pattern. As a further example, FIG. 8 is a schematic diagram of a PCB layer 600 in which trace segments are offset in a single direction. The PCB layer 600 is composed of a substrate with the first fiber glass strands 602 and the second fiber glass strands 604 woven together to create a fiber glass weave pattern having a period 606 extending along the first axis 208. A BGA of the PCB layer 600 is not shown for visualization purposes.

The PCB layer 600 may include a first trace 620 and a second trace 622 that may extend alongside one another. The traces 620, 622 may be differential pairs or single ended traces. The first trace 620 may include a first trace segment 624, a second trace segment 626, and a third trace segment 628 that each extend along the second axis 225. The second trace 622 may include a fourth trace segment 630, a fifth trace segment 632, and a sixth trace segment 634 that each extend along the second axis 225. Although each of the illustrated traces 620, 622 includes three trace segments, the traces 620, 622 may include additional trace segments in additional or alternative embodiments. The second trace segment 626 may be offset from the first trace segment 624 along the first direction 444 such that an offset distance 636, which may be equal to ⅓ of the period 606 of the fiber glass weave pattern, extends between a center of the first trace segment 624 and a center of the second trace segment 626, and the third trace segment 628 may be offset from the second trace segment 626 along the first direction 444 such that the offset distance 636 also extends between a center of the second trace segment 626 and a center of the third trace segment 628. Similarly, the fifth trace segment 632 may be offset from the fourth trace segment 630 along the first direction 444 such that the offset distance 636 extends between a center of the fourth trace segment 630 and a center of the fifth trace segment 632, and the sixth trace segment 634 may be offset from the fifth trace segment 632 along the first direction 444 such that the offset distance 636 also extends between a center of the fifth trace segment 632 and a center of the sixth trace segment 634. In this manner, each of the traces 620, 622 may be continually routed in the same direction (e.g., the first direction 444), thereby creating a step-like profile. Additionally, a distance 638 between the traces 620, 622 along the first axis 208 may be maintained. For example, the distance 638 may be equal to the offset distance 636 for trace segments 624, 626, 628, 630, 632, 634 having a thickness equal to ⅓ of the period 606 of the fiber glass weave pattern.

In the illustrated arrangement of the traces 620, 622, the first trace segment 624 of the first trace 620 and the fifth trace segment 632 of the second trace 622 may extend along corresponding layouts of the fiber glass weave pattern, the second trace segment 626 of the first trace 620 and the sixth trace segment 634 of the second trace 622 may extend along corresponding layouts of the fiber glass weave pattern, and the third trace segment 628 of the first trace 620 and the fourth trace segment 630 of the second trace 622 may extend along corresponding layouts of the fiber glass weave pattern. The first trace segment 624, the second trace segment 626, and the third trace segment 628 may extend along different layouts of the fiber glass weave pattern and/or the fourth trace segment 630, the fifth trace segment 632, and the sixth trace segment 634 may extend along different layouts of the fiber glass weave pattern, and the first trace 620 and the second trace 622 may collectively extend along corresponding layouts of the fiber glass weave pattern.

First intermediate trace segments 640 may electrically couple the first trace segment 624, the second trace segment 626, and/or the third trace segment 628 to one another. Second intermediate trace segments 642 may electrically couple the fourth trace segment 630, the fifth trace segment 632, and/or the sixth trace segment 634 to one another. In additional or alternative embodiments, any of the trace segments 624, 626, 630, 632, 634 may be coupled to one another without intermediate trace segments, such as by directly contacting one another.

Figure 9:
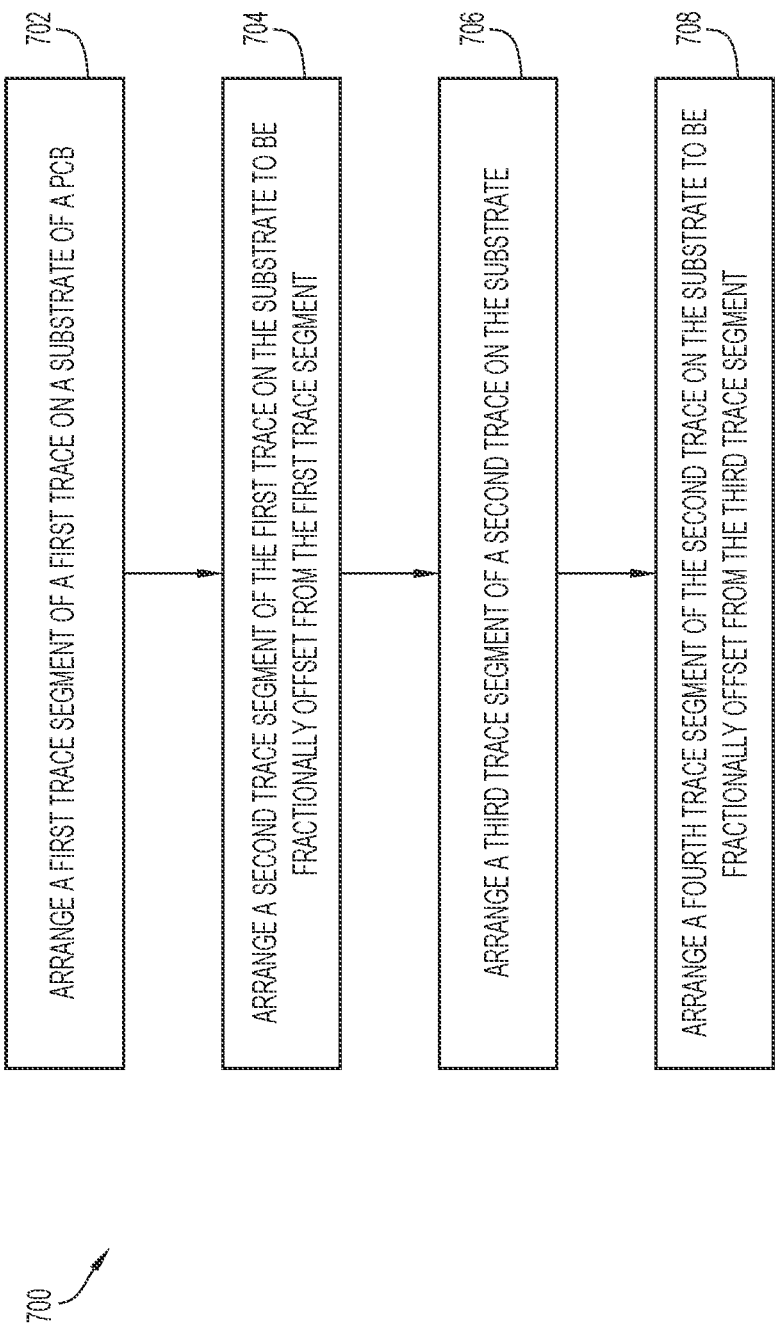
FIG. 9 is a flowchart of a method of manufacture of a PCB, according to an example embodiment.

FIG. 9 is a flowchart of a method 700 of manufacture of a PCB, such as a PCB layer. In certain embodiments, the method 700 may be performed automatically, such as by a processor executing instructions stored on a memory. In additional or alternative embodiments, the method 700 may be performed manually, such as by an operator. It should be noted that the method 700 may be performed differently than depicted. For example, additional operations may be performed, any of the depicted operations may not be performed, and/or the depicted operations may be performed in a different order.

At step 702, a first trace segment of a first trace is arranged on a substrate of the PCB. The substrate of the PCB may be composed of fiber glass strands that define a fiber glass weave pattern, as well as a filler material that secures the fiber glass strands to one another. The first trace segment may extend along or over a first portion of different fiber glass strands of the substrate of the PCB. The BGA includes a pitch in which a separation distance extends along an axis from a center of a first via of the BGA to a center of a second via of the BGA.

At step 704, a second trace segment of the first trace is arranged on the substrate to be fractionally offset from the first trace segment along the axis associated with the pitch of the BGA. That is, the second trace segment is positioned such that a distance between a center of the first trace segment and a center of the second trace segment is less than the pitch of the BGA. The second trace segment may extend along or over a second portion of the fiber glass strands of the substrate of the PCB. In certain embodiments, each of the first trace segment and the second trace segment may be positioned within the BGA. In alternative embodiments, one of the first trace segment or the second trace segment may be positioned within the BGA, and the other of the first trace segment or the second trace segment may be external to the BGA. In either embodiment, the fractional offset of the second trace segment relative to the first trace segment may position each of the first trace segment and the second trace segment in a manner that avoids undesirable electrical coupling of the first trace to the BGA or to any other electrical component of the PCB. In some embodiments, the first trace segment and the second trace segment may be electrically coupled to one another via an intermediate trace segment. Additionally or alternatively, the first trace segment and the second trace segment may directly contact one another to electrically couple to one another.

At step 706, a third trace segment of a second trace is arranged on the substrate of the PCB to extend along or over a third portion of the fiber glass strands of the substrate. The second trace may not be electrically coupled to the first trace or the BGA. For example, the first trace and the second trace may be differential pairs or separate single ended traces. Therefore, the third trace segment may not be in contact with any part of the first trace or the BGA. At step 708, a fourth trace segment of the second trace is arranged on the substrate of the PCB to be fractionally offset from the third trace segment along the axis associated with the pitch of the BGA. The fourth trace segment may extend along or over a fourth portion of the fiber glass strands of the substrate. The third trace segment and the fourth trace segment may be electrically coupled to one another via an intermediate trace segment and/or by directly contacting one another.

In certain embodiments, the third trace segment and/or the fourth trace segment may extend within the BGA. As an example, at least a portion of the first trace (e.g., the first trace segment, the second trace segment) and at least a portion of the second trace (e.g., the third trace segment, the fourth trace segment) may be positioned between the same adjacent vias. As another example, a portion of the first trace may be positioned between adjacent vias, and a portion of the second trace may be positioned between different adjacent vias. The position of the third trace (e.g., the fractional offset of the third trace segment relative to the fourth trace segment) may avoid undesirable electrical coupling of the second trace to the BGA or to any other electrical component of the PCB.

The first trace and the second trace may be arranged on the substrate to control the respective impedances of the first trace and the second trace. For instance, the first trace segment, the second trace segment, the third trace segment, and/or the fourth trace segment may be arranged to cause the respective impedances to substantially match one another, thereby causing the first trace and the second trace to propagate respective signals at substantially the same speed to reduce skew. To this end, the first trace segment, the second trace segment, the third trace segment, and/or the fourth trace segment may be arranged based on the fiber glass weave pattern such that the first trace and the second trace collectively extend along corresponding, common, or similar layouts of the fiber glass weave pattern. As an example, the first trace segment of the first trace may extend over a corresponding layout of the fiber glass weave pattern as that over which the fourth trace segment of the second trace extends, and the second trace segment of the first trace may extend over a corresponding layout of the fiber glass weave pattern as that over which the third trace segment of the second trace extends. Such arrangements of the first trace and of the second trace are effectuated by the fractional offsets between the first trace segment and the second trace segment and between the third trace segment and the fourth trace segment. For example, the trace segments may be offset by specific amounts (e.g., the offset between the first trace segment and the second trace segment may be equal to the offset between the third trace segment and the fourth trace segment) and/or in specific directions (e.g., the second trace segment is offset from the first trace segment in a direction that is opposite in which the fourth trace segment is offset from the third trace segment, the second trace segment is offset from the first trace segment in the same direction in which the fourth trace segment is offset from the third trace segment) to enable the first trace and the second trace to extend over corresponding layouts of the fiber glass weave pattern.

In some embodiments, trace segments having particular dimensions may also be selected to control the respective impedances of the traces and reduce skew. For example, trace segments having certain lengths and/or thicknesses/widths may be selected such that the traces collectively extend over corresponding layouts of the fiber glass weave pattern.

The trace routing techniques described herein may reduce skew between traces of a PCB. Reducing skew between traces improves operation of the PCB associated with signal propagation along the traces, such as to enable better signal synchronization, improve signal integrity, and/or facilitate desirable communication between electrical components of the PCB. Additionally, the disclosed trace routing techniques limit an overall space occupied by the traces, thereby enabling more efficient usage of the PCB and/or reducing a cost of manufacture of the PCB.

The trace routing techniques include fractionally offsetting respective trace segments for each trace relative to one another such that the traces collectively extend over corresponding layouts of a fiber glass weave pattern of a substrate of the PCB. Such fractional offsets between trace segments may position the traces to avoid undesirable electrical coupling with one another, with a BGA of the PCB, and/or with other electrical components of the BGA.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function]. . . or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A printed circuit board (PCB), comprising:
    a substrate composed of a fiber glass material woven together to create a fiber glass weave pattern;
    a first trace comprising a first plurality of trace segments electrically coupled to one another, wherein the first plurality of trace segments comprises a first trace segment and a second trace segment fractionally offset from one another along an axis by a first distance that is less than a ball grid array (BGA) pitch of a BGA of the PCB, the BGA pitch being a separation distance along the axis between a center of a first via of the BGA and a center of a second via of the BGA, and wherein the first trace segment extends between the first via and the second via; and
    a second trace comprising a second plurality of trace segments electrically coupled to one another, wherein the second plurality of trace segments comprises a third trace segment and a fourth trace segment fractionally offset from one another along the axis by a second distance that is less than the BGA pitch to extend the first plurality of trace segments and the second plurality of trace segments along corresponding layouts of the fiber glass weave pattern of the substrate, wherein the third trace segment extends alongside the first trace segment external to the first via and the second via.

2. The PCB of claim 1, wherein the first trace segment and the second trace segment of the first plurality of trace segments extend along different layouts of the fiber glass weave pattern, and the third trace segment and the fourth trace segment of the second plurality of trace segments extend along different layouts of the fiber glass weave pattern.

3. The PCB of claim 1, wherein the first trace segment of the first plurality of trace segments and the third trace segment of the second plurality of trace segments extend alongside one another, the second trace segment of the first plurality of trace segments is fractionally offset from the first trace segment along the axis by the first distance in a first direction, and the fourth trace segment of the second plurality of trace segments is fractionally offset from the third trace segment along the axis by the second distance in a second direction, opposite the first direction.

4. The PCB of claim 1, wherein the first trace segment of the first plurality of trace segments and the third trace segment of the second plurality of trace segments extend alongside one another, and the second trace segment of the first plurality of trace segments is fractionally offset from the first trace segment along the axis by the first distance and the fourth trace segment of the second plurality of trace segments is fractionally offset from the third trace segment along the axis by the second distance in the same direction.

5. The PCB of claim 1, wherein the first trace segment of the first plurality of trace segments and the third trace segment of the second plurality of trace segments are positioned within the BGA.

6. The PCB of claim 5, wherein the second trace segment of the first plurality of trace segments and the fourth trace segment of the second plurality of trace segments are positioned external to the BGA.

7. The PCB of claim 1, wherein the first distance in which the first trace segment and the second trace segment of the first plurality of trace segments are fractionally offset from another and the second distance in which the third trace segment and the fourth trace segment of the second plurality of trace segments are fractionally offset from one another are equal to one another.

8. The PCB of claim 1, wherein the first trace and the second trace are differential pairs or single ended traces.

9. The PCB of claim 1, wherein the fiber glass material comprises first fiber glass strands and second fiber glass strands woven together to create the fiber glass weave pattern having a period, the period being a distance between centers of adjacent first fiber glass strands, and each of the first distance in which the first trace segment and the second trace segment of the first plurality of trace segments are fractionally offset from another and the second distance in which the third trace segment and the fourth trace segment of the second plurality of trace segments are fractionally offset from one another is less than the period.

10. A method of manufacturing a printed circuit board (PCB), comprising:
    arranging a first trace segment of a trace on a substrate of the PCB to extend along a first axis and within a space extending between a first via of a ball grid array (BGA) and a second via of the BGA, wherein the substrate is composed of fiber glass strands that define a fiber glass weave pattern; and
    arranging a second trace segment of the trace on the substrate at a position that is fractionally offset from the first trace segment along a second axis, transverse to the first axis, by a distance that is less than a BGA pitch based on the fiber glass weave pattern such that the second trace segment is offset from the space extending between the first via and the second via, wherein the BGA pitch is a separation distance along the second axis between a center of the first via of the BGA and a center of the second via of the BGA.

11. The method of claim 10, comprising:
arranging a third trace segment of an additional trace on the substrate of the PCB to extend offset from the space extending between the first via and the second via; and
arranging a fourth trace segment of the additional trace on the substrate at an additional position that is fractionally offset from the third trace segment along the second axis by an additional distance that is less than the BGA pitch of the BGA to extend the additional trace and the trace along corresponding layouts of the fiber glass weave pattern.

12. The method of claim 11, comprising:
arranging the third trace segment of the additional trace to extend alongside the first trace segment of the trace;
arranging the second trace segment of the trace to fractionally offset the second trace segment from the first trace segment along the second axis in a first direction; and
arranging the fourth trace segment of the additional trace to fractionally offset the fourth trace segment from the third trace segment in a second direction, opposite the first direction.

13. The method of claim 11, comprising:
arranging the third trace segment of the additional trace to extend alongside the first trace segment of the trace;
arranging the second trace segment of the trace to fractionally offset the second trace segment from the first trace segment along the second axis in a direction; and
arranging the fourth trace segment of the additional trace to fractionally offset the fourth trace segment from the third trace segment along the second axis in the direction.

14. The method of claim 11, comprising arranging the first trace segment and the second trace segment of the trace and the third trace segment and the fourth trace segment of the additional trace on the substrate of the PCB such that the distance in which the first trace segment and the second trace segment are fractionally offset from one another is equal to the additional distance in which the third trace segment and the fourth trace segment are fractionally offset from one another.

15. A printed circuit board (PCB), comprising:
a substrate composed of a plurality of fiber glass strands that are woven together to create a fiber glass weave pattern;
a first trace comprising a first plurality of trace segments electrically coupled to one another, wherein the first plurality of trace segments comprises a first trace segment and a second trace segment extending along a first axis and fractionally offset from the first trace segment along a second axis, transverse to the first axis, in a first direction by a first distance; and
a second trace comprising a second plurality of trace segments electrically coupled to one another, wherein the second plurality of trace segments comprises a third trace segment and a fourth trace segment extending along the first axis and fractionally offset from the third trace segment along the second axis in a second direction, opposite the first direction, by a second distance to extend the first plurality of trace segments and the second plurality of trace segments along corresponding layouts of the fiber glass weave pattern of the substrate, the first trace segment and the third trace segment extending alongside one another, and the second trace segment and the fourth trace segment extending alongside one another.

16. The PCB of claim 15, wherein the first trace segment of the first plurality of trace segments and the fourth trace segment of the second plurality of trace segments extend along first corresponding layouts of the fiber glass weave pattern, and the second trace segment of the first plurality of trace segments and the third trace segment of the second plurality of trace segments extend along second corresponding layouts of the fiber glass weave pattern.

17. The PCB of claim 15, wherein each of the first distance and the second distance is less than a pitch of a ball grid array (BGA) of the PCB, the pitch being a separation distance along the second axis between a center of a first via of the BGA and a center of a second via of the BGA.

18. The PCB of claim 17, wherein the plurality of fiber glass strands includes a first plurality of fiber glass strands and a second plurality of fiber glass strands that are woven together to create the fiber glass weave pattern having a period, the period being an additional separation distance along the second axis between centers of adjacent fiber glass strands of the first plurality of fiber glass strands, the pitch of the BGA is equal to at least one period of the fiber glass weave pattern plus a portion of an additional period of the fiber glass weave pattern, and a value of the first distance in which the first trace segment and the second trace segment of the first plurality of trace segments are fractionally offset from another and a value of the second distance in which the third trace segment and the fourth trace segment of the second plurality of trace segments are fractionally offset from one another are equal to the portion of the additional period.

19. The PCB of claim 17, wherein the plurality of fiber glass strands includes a first plurality of fiber glass strands and a second plurality of fiber glass strands that are woven together to create the fiber glass weave pattern having a period, the period being an additional separation distance along the second axis between centers of adjacent fiber glass strands of the first plurality of fiber glass strands and the period being less than the pitch of the BGA, and each of the first distance and the second distance is less than the period.

20. The method of claim 10, wherein arranging the second trace segment on the substrate comprises arranging the second trace segment such that at least a portion of the second trace segment is collinear with one of the first via or the second via.

* * * * *